United States Patent [19]

Tsividis

[11] Patent Number: 4,749,957

[45] Date of Patent: Jun. 7, 1988

[54] SEMICONDUCTOR TRANSCONDUCTOR CIRCUITS

[75] Inventor: Yannis Tsividis, New York, N.Y.

[73] Assignee: Trustees of Columbia University, New York, N.Y.

[21] Appl. No.: 23,195

[22] Filed: Mar. 9, 1987

Related U.S. Application Data

[63] Continuation-in-part of Ser. No. 834,323, Feb. 27, 1986, abandoned.

[51] Int. Cl.$^4$ .............................................. H03F 3/45
[52] U.S. Cl. ..................................... 330/253; 330/257
[58] Field of Search ............... 330/253, 254, 257, 269, 330/277, 284; 307/550, 554, 568

[56] References Cited

U.S. PATENT DOCUMENTS

| | | | |
|---|---|---|---|
| 3,763,382 | 10/1973 | Horichi et al. | 330/284 X |
| 3,840,756 | 10/1974 | Jones | 330/254 X |
| 3,984,780 | 10/1976 | Hsiao et al. | 330/253 |
| 4,157,557 | 6/1979 | Sato et al. | 307/568 X |
| 4,459,555 | 7/1984 | Jett, Jr. | 330/253 |

FOREIGN PATENT DOCUMENTS 57-41012  3/1982  Japan .................................. 330/254

OTHER PUBLICATIONS

Khorramabadi et al. "High Frequency CMOS Continuous-Time Filters", *IEEE Journal of Solid-State Circuits*, vol. SC-19, No. 6, Dec. 1984, pp. 939-948.

*Primary Examiner*—James B. Mullins
*Attorney, Agent, or Firm*—Brumbaugh, Graves, Donohue & Raymond

[57] ABSTRACT

A voltage-tuned transconductor with reduced even-order and odd-order nonlinearities is obtained by using a pair of control MOS transistors each interconnected between a separate pair of matched balancing transistors. Such transconductors are useful in a variety of applications either with a balanced or single-ended load.

10 Claims, 2 Drawing Sheets

SEMICONDUCTOR TRANSCONDUCTOR CIRCUITS

RELATED APPLICATIONS

This application is a continuation-in-part of my application Ser. No. 834,323, filed Feb. 27, 1986, and now abandoned, which is related to an application Ser. No. 834,321, filed Feb. 27, 1986 by Zdzislaw Czarnul and having a common assignee.

FIELD OF THE INVENTION

This invention relates to semiconductor integrated circuits and more particularly to such circuits which include voltage-tunable resistive elements or transconductive elements, such as continuous-time integrators and continuous-time filters.

BACKGROUND OF THE INVENTION

For use in circuits such as continuous-time integrators and continuous-time filters, there is a need for a circuit element or network which acts as a transconductor whose transconductance can be voltage-tuned, and several proposals are described in the literature directed to such ends. It is particularly advantageous that this network be linear over its dynamic range.

Typically these transconductors involve MOS transistors operating in saturation where the transconductance is related to the difference between the source-gate voltage and the threshold voltage of the transistors. To compensate for fabrication tolerances and temperature variations in the filter as a whole, this difference must be permitted to vary by a factor of two to three typically. This results in a permitted variation of drain current of between four and nine times. Because in these circuits this current is carried by other devices in series with the mentioned transconductor devices, other voltage drops in the circuit also vary. Moreover, in a practical case, the circuits must be designed so that these variations are accommodated with a limited power supply. As a consequence, such proposed transconductors suffer from limited signal-handling capability, and so have a small dynamic range and are subject to significant transconductance mismatch because of threshold voltage variations among the transistors making up the network. This results in undesirably high levels of total harmonic distortion over normal operating ranges. The present invention seeks to improve over these proposals.

It is currently well known to employ a field effect transistor (FET) as a voltage-variable transconductor using the gate voltage for tuning the transconductance. It has also been recognized that in such a transconductor the transconductance available between the two current-bearing terminals of the FET is subject to large even-order non-linearities. To reduce such non-linearities, it has been proposed to connect the FET between a pair of transistors, as shown in FIG. 1, to reduce the non-linearities. This circuit will be discussed in more detail below. However, this arrangement results merely in the reduction of the even-order non-linearities, with little effect on the odd-order non-linearities, so that the transconductance is still subject to significant non-linearities.

The present invention seeks to reduce such odd-order linearities to improve the linearity of the transconductance.

SUMMARY OF THE INVENTION

To this end, a transconductor in accordance with an illustrative embodiment of the invention employs a matched pair of control FETs, preferably of the MOS type so interconnected in a compensating network that effectively both the odd and even order non-linearities of the individual control FETs cancel and there is available a hybrid transconductance which is largely the difference in the transconductances of the two FETs. In particular, the compensating network comprises two matched pairs of voltage-follower current-transfer elements, and each control FET is connected between a separate pair of the elements. In a preferred embodiment, each of the voltage-follower current-transfer means is a MOS transistor, and the first control FET is connected between the source of the first and second MOS transistors forming the first pair of matched voltage followers, and the second control FET is connected between the third and fourth MOS transistors forming the second pair of voltage follower elements. Balanced input signals are applied to the gates of the two pairs of MOS transistors and different control voltages are applied to the gates of the first and second control FETs. The desired transconductance is derived across a double-ended output, the first terminal of which is connected to the drains of the first and fourth MOS transistors and the second terminal of which is connected between the drains of the second and third MOS transistors. Single-ended outputs are also possible.

The invention will be better understood from the following more detailed description taken in conjunction with the accompanying drawing in which

DETAILED DESCRIPTION

Figure 1:
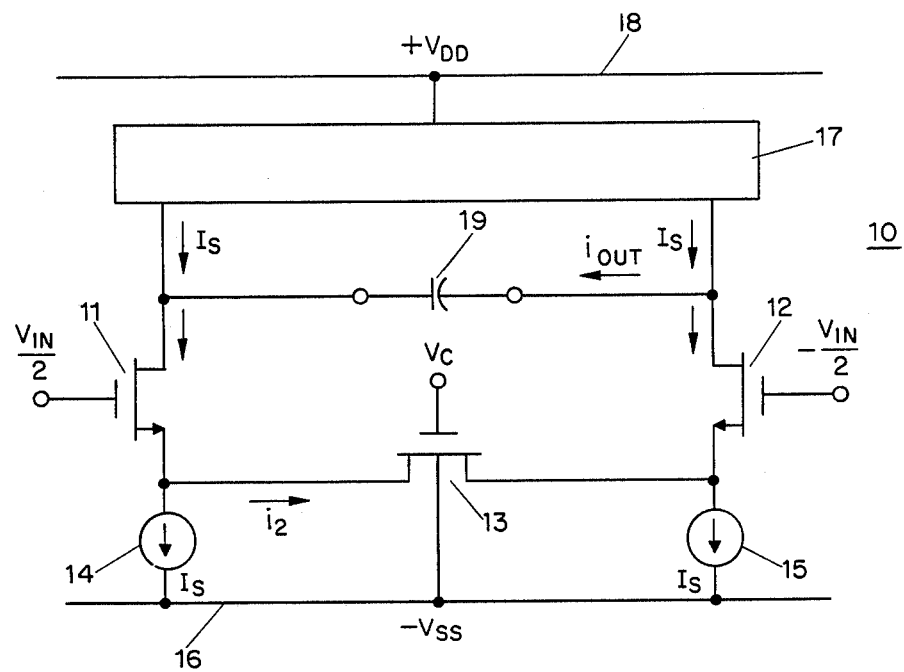
FIG. 1 shows, partially in block and partially in circuit schematic form, essentially a prior art arrangement useful for canceling out even-order nonlinearities in the transconductance resulting from a single control FET transistor.

With reference now to the drawing, FIG. 1 shows a transconductance network or transconductor 10 comprising a pair of matched MOS transistors 11 and 12 and a control MOS transistor 13. The transistors 11 and 12 typically would be N-channel enhancement transistors, and the desired matching would be achieved by having the two transistors located close together on the semiconductive chip and processed in identical fashion. The third transistor 13 also is an N-channel enhancement mode transistor but may alternatively be a P-channel enhancement mode type as will be discussed later. The control transistor 13 has different ones of its two current-handling electrodes, source and drain, connected to the sources of transistors 11 and 12, thereby connecting its channel between the two. The tuning voltage is applied to the gate of transistor 13 effectively to control its conductance. The voltage is chosen to operate transistor 13 in its relatively linear range. Equal current controlling elements 14 and 15 are connected between the sources of each of transistors 11 and 12 and the more negative bus 16 of the DC voltage supply (not shown). The substrate of transistor 13 is also connected to the negative bus 16. The active load 17 shown in block form is connected between the drains of the two electrodes. Also connected there between is the capacitor 19 to represent the capacitive load that would characterize the use of the transconductor in a continuous-time integrator. A third terminal of the active load is connected to the more positive bus 19 of the DC voltage supply. Typically the power supply would include a positive bus maintained above the ground level and a negative bus maintained below the gound level. Balanced equal and opposite voltages are supplied to the gates of transistors 11 and 12 and serve as the input.

It can be shown that if the operation is limited to the non-saturation regions of the transistors, the output current in the capacitor 19 is a function of the conductance of the control transistor 13, with an odd-order nonlinearity related to parameters of the matched transistors, and the magnitudes of the applied DC voltages.

It can be seen that the circuit is a large signal transconductor whose transconductance is tunable through the voltage applied to the gate of the control transistor. It should also be noted that the bias current which passes through the matched transistors is not passed through the control transistor and does not have to be varied for tuning. The tuning voltage can, accordingly, be always large. It should also be noted that in this circuit, the resistance of the channel of the control transistor desirably is high, in contrast to circuits where such a transistor has been used to interconnect two nodes whose potentials are to be equalized.

The circuit will go out of its improved linear region only when the control transistor goes into saturation or when the output current approaches the current flowing in each of the matched pair of transistors.

For optimum swing, the output quiescent or average voltage may be chosen higher than zero, which may require DC level shifters or AC coupling for driving a following stage.

In the arrangement depicted, the substrate of the control transistor 13 is shown connected to the negative bus 16 of the voltage supply corresponding to the use of an N-channel enhancement-mode transistor for this role. The N-type matched transistors would have their substrates to the negative bus or to their sources. Alternatively, a P-channel transistor may be substituted in which case its substrate would be connected to the positive bus of the voltage supply.

Moreover, it is well understood that the roles of source and drain in an MOS transistor are interchangeable, each serving as one of the two current handling electrodes of an MOS transistor.

Figure 2:
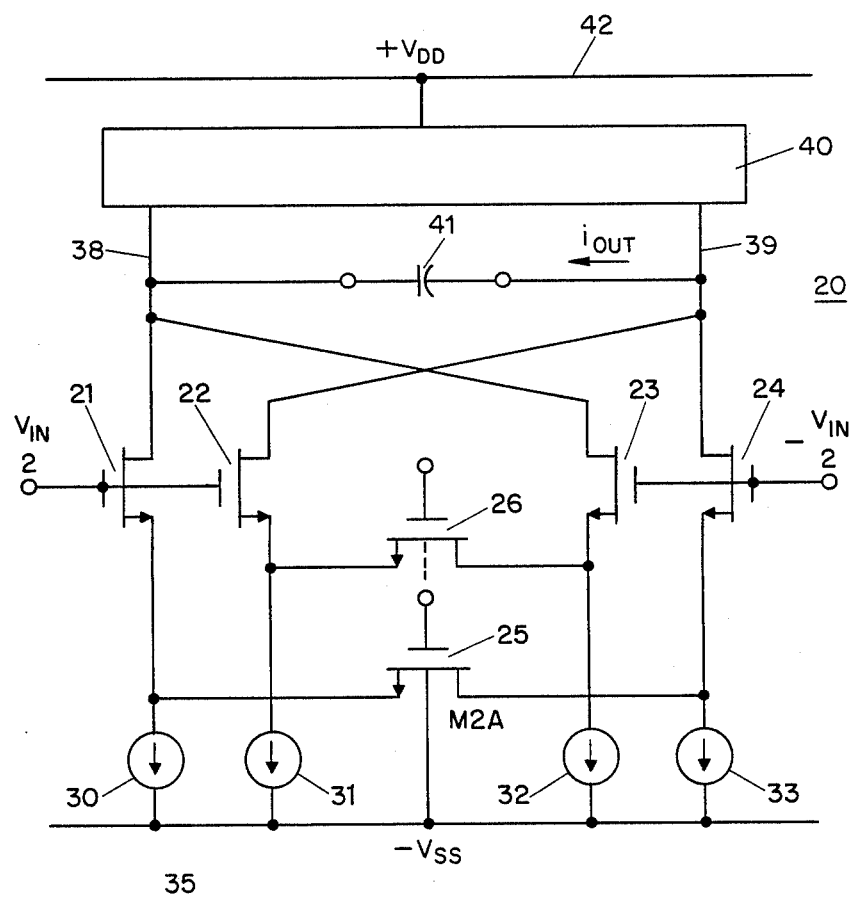
FIG. 2 shows similarly an embodiment of the invention useful for canceling out both the even-order and odd-order nonlinearities of the net transconductance resulting from a pair of control FET transistors properly interconnected.

In accordance with the present invention there is eliminated the odd-order nonlinearity characteristic of the transconductor shown in FIG. 1 by the circuit arrangement shown in FIG. 2.

The transconductor 20 shown in FIG. 2 comprises four N-Type MOS transistors 21, 22, 23 and 24 of which transistor 21 is matched to transistor 24, and transistor 22 is matched to transistor 23, and the two control MOS N-type transistors 25 and 26 are matched to one another. The transistors 21–24 are each connected by way of current controlling elements 30, 31, 32 and 33, respectively, to the negative bus 35 of the DC voltage supply (not shown). Each of the current controlling elements may be a separate MOS transistor whose channel is connected between the source of a corresponding one of transistors 21, 22, 23 and 24 and the negative power supply bus and whose gates are biased to permit the desired current to flow in the channel. The first control transistor 25 has its channel connected between the sources of transistors 21 and 24 and the second control transistor 26 has its channel connected between the sources of transistors 22 and 23. The substrates of matched transistors 25 and 26 are each connected to the negative bus 35.

The same first input voltage is applied to the gates of transistors 21 and 22 and an input voltage equal in magnitude but opposite to the first input voltage is applied to the gates of transistors 23 and 24. The drains of transistors 21 and 23 are connected together to one terminal 38 of the two balanced output terminals and the drains of transistors 22 and 24 are interconnected to the other terminal 39 of the two balanced output terminals. The active load 40 and the capacitor 41 are connected in parallel across the two output terminals 38, 39. A third lead of the active load is connected to the positive bus 42 of the power supply.

In the preferred form, each of the transistors is of the N-channel enhancement-mode type. As before, if desired, the control transistors 25, 26 can each be of the P-channel enhancement-mode type, in which case their substrates are connected to the positive bus of the voltage supply.

It can be shown that in this circuit arrangement the net transconductance viewed across the output terminals 38, 39 is determined essentially by the difference in the conductances of the two control transistors 25 and 26. To achieve different conductances for the two transistors and so to have a net difference, different control voltages are supplied to the gates of the two transistors, and either or both of these voltages may be varied to vary the net transconductance available at the output.

Moreover, it can be shown that ideally due to the device characteristics in the net transconductance, both the even-order and odd-order nonlinearities in the transconductances of the individual transistors essentially cancel out while operation is limited to the nonsaturation region of each control transistor.

Moreover, practical nonidealities such as imperfectly balanced transistors, mobility dependence on gate voltage and mismatches do not seriously degrade performance. Also, the circuit is relatively independent of differences in threshold voltages of the two control transistors and of substrate noise and other noise common to the two control transistors.

Further, it is to be noted that the bias current which passes through the balancing transistors does not flow through any of the control transistors that determine the transconductance and, accordingly, does not need to be varied for tuning.

It can be appreciated that the circuit shown in FIG. 2 also can be viewed as a multiplier whose output current is proportional to the product of the input voltage and the difference of the two applied control voltages.

Figure 3:
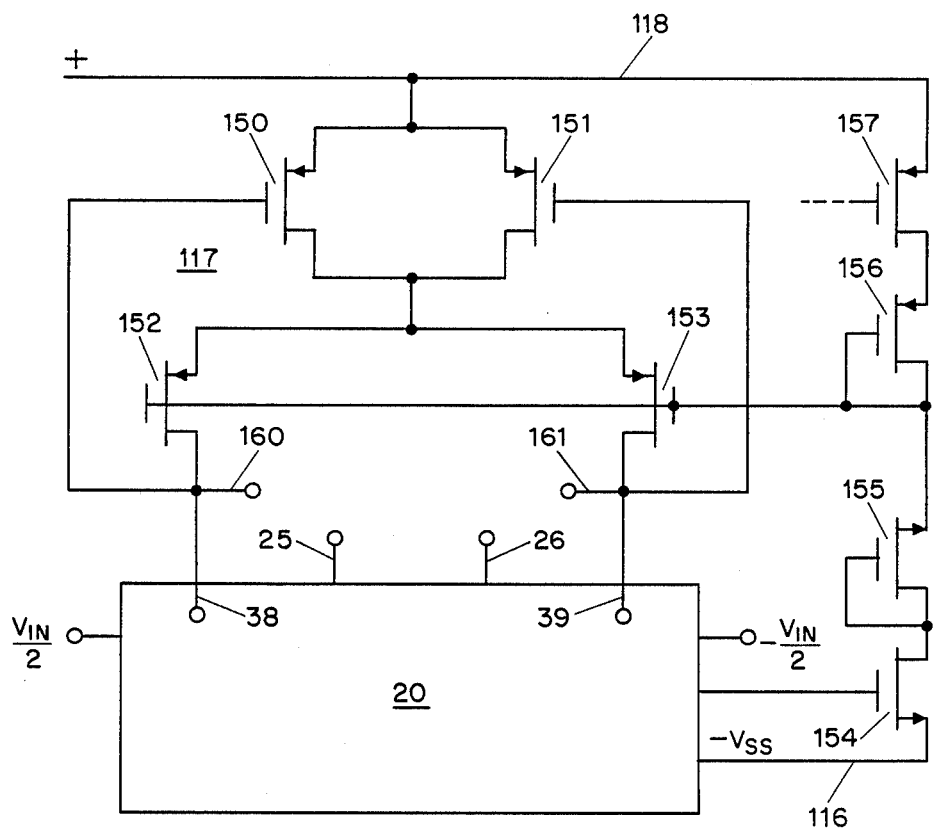
FIG. 3 shows similarly the embodiment of FIG. 2 with a differential active load.

With reference now to FIG. 3, there is shown a circuit 100 which comprises a transconductor 20 (shown in block form) of the kind shown in FIG. 2 including an active balanced load for providing a desired voltage-tunable transconductance across a pair of output terminals 160, 161 corresponding to terminals 38, 39 respectively, of the transconductor 20. The active load 117 is connected between the positive bus 118 and the output terminals 160, 161 and is of the type described in a paper by Khorramabadi and Gray entitled "High Frequency CMOS Continuous-Time Filters" published in IEEE Journal of Solid-State Circuits, 1984 SC-19, pp. 939-948. It comprises P-type channel transistors 150, 151 whose sources are each connected to the positive bus 118 and whose gates are connected to the two output terminals 160, 161. P-channel transistors 152, 153 have their sources connected together and to the drains of each of transistors 151, 152, and their drains are connected to the output terminals 160, 161, respectively.

Also serially connected between the negative bus 116 and the positive bus 118 are N-channel transistors, 154 and 155, and P-channel transistors, 156 and 157, which form taps of a voltage divider network to provide taps at which desired voltages may be obtained. Transistor 154 is biased to fix the current level through the voltage divider. Each of transistors 155 and 156 is connected as a diode with its gate shorted to its drain and serves as a voltage level shifter. The drain of transistor 156 is connected to the gates of each of transistors 152 and 153 and sets the current of each of these transistors. Transistor 157 has its gate grounded.

As discussed in the aforementioned paper, an active load of this kind provides common mode feedback which helps stabilize the voltages at the two output nodes 160, 161 with respect to ground.

This circuit is useful to provide a desired transconductance which is tunable by the voltages applied to the gates of control transistors of the transconductor 20 and which is available between the output terminals 160, 161 for a variety of circuit applications. As previously mentioned, it should be especially useful for use in a continuous-time integrator in which case a capacitor would be connected between the output nodes.

Figure 4:
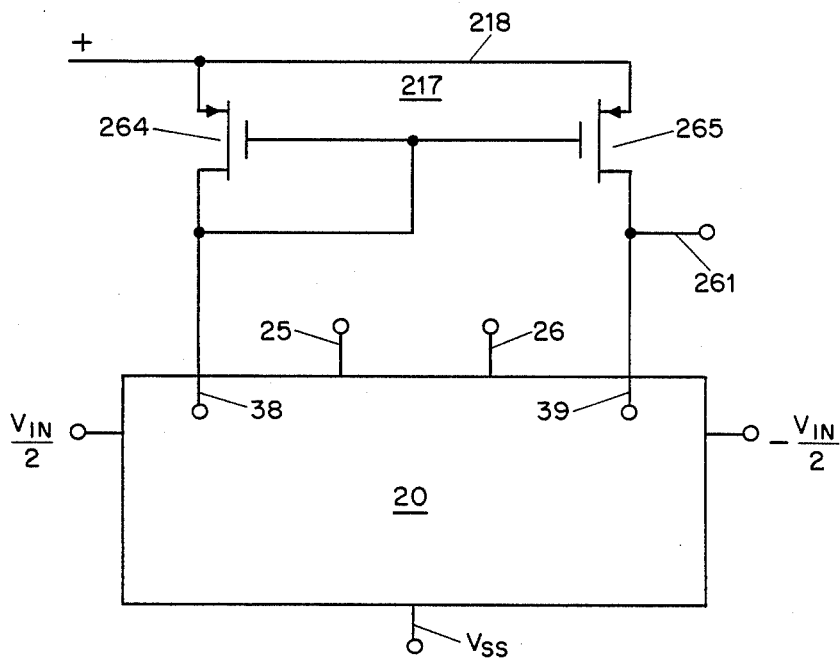
FIG. 4 shows similarly the embodiment of FIG. 2 with a single-ended active load.

FIG. 4 shows the circuit 200 which includes the transconductor 20 shown in FIG. 2 with an active load that provides a single-ended output. The active load 217 comprises P-channel transistors 264 and 265 whose sources are each connected to the positive bus 218 and whose gates are interconnected and output terminal 38 of the transconductor 20. The output terminal 39 of the transconductor 20 is connected to the drain of transistor 265 together they serve as the single output node 261. Basically the transistors 264 and 265 serve as a current mirror to provide a single-ended output at node 261. A circuit of the kind describe provides a transconductance which can be tuned by voltages applied to the gates of control transistors of the transconductor 20 and which is available at the output 261.

It is to be understood that the specific embodiments described are merely illustrative of the general principles of the invention. Various other embodiments may be devised without departing from the spirit and scope of the invention.

In particular, as known in the art by appropriate changes in polarities of the applied voltages, either N- or P-channel transistors or both could be used in the circuits described. Moreover, while enhancement mode-type transistors have been, depletion mode-type may similarly be used with appropriate circuit modifications.

In addition, it can be appreciated that in the basic circuit shown in FIG. 2, the MOS transistors 21-24 function simply as voltage followers or current transfer means and that accordingly, other such current transfer networks can be substituted, such as appropriately matched bipolar transistors, junction field effect transistors (JFETs), or combinations of transistors such as Darlington pairs.

In addition, it is feasible to use as the control transistors 25, 26 other forms of field effect transistors including JFETs and other forms of field effect transistors.

Similarly, transconductors of the kind described should prove useful in filters, signal processors, voltage controlled amplifier, multipliers and modulators.

I claim:

1. A transconductor comprising first, second, third and fourth voltage follower means, each including first and second electrodes and a control electrode, the first and fourth being matched to one another, the second and third being matched to one another;

first and second field effect transistors, each including first and second electrodes and a control electrode;

first and second input nodes;

first and second output nodes;

first and second control nodes;

first and second voltage buses;

the control electrodes of the first and second voltage follower means being connected to the first input node;

the control electrodes of the third and fourth voltage follower means being connected to the second input node;

the first and second electrodes of the first field effect transistor being connected to the first electrodes of the first and fourth voltage follower means, respectively;

the first and second electrodes of the second field effect transistor being connected to the first electrodes of the second and third voltage follower means, respectively;

the first electrodes of each of the four voltage follower means being connected to the first bus by way of separate current limiting means;

the second electrodes of the first and third voltage follower means being connected to the first output node;

the second electrode of the second and fourth voltage follower means being connected to the second output node;

and load means connected between the two output nodes and the second bus.

2. The transconductor of claim 1 in which the load means is balanced.

3. The transconductor of claim 1 in which the load is single ended.

4. The transconductor of claim 1 in which the input nodes are connected to points of equal and opposite voltages.

5. The transconductor of claim 1 in which the two control nodes are connected to points of different voltages, whose difference determines the transconductance of the transconductor.

6. A transconductor comprising first, second, third and fourth transistors of which the first and fourth are matched to one another and the second and third matched to one another, and fifth and sixth transistors matched to one another, each having first and second electrodes and a control electrode;

first and second input nodes, and first and second output nodes, first and second voltage buses;

the first electrodes of each of the first, second, third and fourth transistors being connected to the first bus by way of separate matched current limiting means;

the control electrodes of the first and second transistors being connected to the first input node, the control electrodes of the third and fourth transistors being connected to the second input node;

the first and second electrodes of the fifth transistor being connected to the first electrodes of the first and fourth transistors, respectively;

the first and second electrodes of the sixth transistor being connected to the first electrodes of the second and third transistors, respectively, the second electrodes of the first and third transistors being interconnected to the first output node, the second electrodes of the second and fourth transistors being interconnected to the second output node, and load means interconnected between the first and second output nodes and the second voltage bus.

7. The transconductor of claim 6 in which the load means is balanced.

8. The transconductor of claim 6 in which the load means is single-ended.

9. The transconductor of claim 6 in which the input nodes are connected to points of equal but opposite potential.

10. The transconductor of claim 6 in which the control electrodes of the fifth and sixth transistors are connected to points of different potentials, whose difference controls its transconductance.

* * * * *

UNITED STATES PATENT AND TRADEMARK OFFICE
CERTIFICATE OF CORRECTION

PATENT NO. : 4,749,957
DATED : June 7, 1988
INVENTOR(S) : Yannis Tsividis

It is certified that error appears in the above-identified patent and that said Letters Patent is hereby corrected as shown below:

Column 5, line 11, "transistors 151, 152" should read -- transistors 150, 151 --.

Signed and Sealed this

Third Day of January, 1989

Attest:

DONALD J. QUIGG

Attesting Officer

Commissioner of Patents and Trademarks